(12) United States Patent
Nagahara et al.

(10) Patent No.: US 7,294,560 B1
(45) Date of Patent: Nov. 13, 2007

(54) METHOD OF ASSEMBLING ONE-DIMENSIONAL NANOSTRUCTURES

(75) Inventors: Larry A. Nagahara, Phoenix, AZ (US); Islamshah S. Amlani, Chandler, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 11/605,901

(22) Filed: Nov. 28, 2006

(51) Int. Cl.
*H01L 21/326* (2006.01)
*H01L 21/479* (2006.01)

(52) U.S. Cl. .................. 438/466; 438/101; 438/17; 257/E51.004; 977/700; 977/742; 977/784

(58) Field of Classification Search ............... 438/466; 257/1; 324/217
See application file for complete search history.

(56) References Cited

U.S. PATENT DOCUMENTS

| | | | |
|---|---|---|---|
| 6,879,143 B2 | 4/2005 | Nagahara et al. | |
| 6,894,359 B2* | 5/2005 | Bradley et al. | 257/414 |
| 7,183,003 B2* | 2/2007 | Leu et al. | 428/408 |
| 2002/0119286 A1* | 8/2002 | Chen et al. | 428/131 |
| 2004/0043527 A1* | 3/2004 | Bradley et al. | 438/48 |
| 2005/0189655 A1 | 9/2005 | Furukawa et al. | |
| 2005/0253220 A1 | 11/2005 | Lin et al. | |
| 2006/0063318 A1 | 3/2006 | Datta et al. | |
| 2007/0020919 A1* | 1/2007 | Adem et al. | 438/629 |

OTHER PUBLICATIONS

Hilding, Jenny, et al., Alignment of Dispersed Multiwalled Carbon Nanotubed in Low Strength AC Electricial Fields, Journal of Nanoscience and Nanotechnology, vol. 5, No. 5, May 2005.

Dittmer, S., et al. Electric field aligned growth of single-walled carbon nanotubes, Current Applied Physics 4, (2004) pp. 595,598.

Yamamoto, K., et al., Orientation and purification of carbon nanotubes using ac electrophoresis, J. Phys. D., Phys. 31 (1998) L-34-L36.

Chung, J., et al. Nanoscale gap fabrication and integration of carbon nanotubes by micromachining, Sensor and Actuators A, 104, (2003) 229-235.

Chen, C. and Zhang, Y., Manipulation of single-walled carbon nanotubes into dispersively aligned arrays between metal electrodes, Journal of Physics D: Applied Physics, 39 (2006) 172-176.

Kocabas, C., et al, Spatially Selective Guided Growth of High-Coverage Arrays and Random Networks of Single-Walled Carbon Nanotubes and Their Intefration into Electronic Devices, J.Am. Chem. Soc., 2006, 128, 4540-4541.

(Continued)

*Primary Examiner*—Michael Lebentritt
*Assistant Examiner*—Abdulfattah Mustapha

(57) ABSTRACT

A method provides a simple yet reliable technique to assemble one-dimensional nanostructures selectively in a desired pattern for device applications. The method comprises forming a plurality of spaced apart conductive elements (12, 20) in a sequential pattern (26) on a substrate (17) and immersing the plurality of spaced apart conductive elements (12, 20) in a solution (23) comprising a plurality of one-dimensional nanostructures (22). A voltage is applied to one of the plurality of spaced apart conductive elements (12, 20) formed in the sequential pattern (26), thereby causing portions of the plurality of one-dimensional nanostructures (22) to migrate between adjacent conductive elements (12, 20) in sequence beginning with the one of the plurality of spaced apart conductive elements (12, 20) to which the voltage is applied.

20 Claims, 3 Drawing Sheets

OTHER PUBLICATIONS

Heinze, S., et al. Electrostatic engineering of nanotube transistors for improved performance, Applied Physics Letter, Vo, 83, No. 34, Dec. 15, 2003, 5038-5040.

Wind, S. J., et al., Lateral Scaling in Carbon-Nanotube Field-Effect Transistors, Physical Review Letters, vol. 91, No. 5, Aug. 1, 2003, 058301-1-4.

Kocabas, C., Guided growth of large-scale, horizontally aligned arrays of single-walled carbon nanotubes and their use in thin-film transistors, small 2005, 1, No. 11, 1110-1116.

Huang, Yu, et al., Nanowires for integrated multicolor nanophotonics, DOI: 10.1002/smll.200400030. Small, 2005.

Lewenstein, J., et al , High-yield selective placement of carbon nanotubes on pre-patterned electrodes, Nano leters, 2002, vol. 2, No. 5, 443-446.

Nagahara et al, Directed placement of suspended carbon nanotubes for nanometer-scale assembly, American Institute of Physics, vol. 80, No. 20, May 20, 2002.

* cited by examiner

METHOD OF ASSEMBLING ONE-DIMENSIONAL NANOSTRUCTURES

FIELD OF THE INVENTION

The present invention generally relates to one-dimensional nanostructures and more particularly to a method of forming one-dimensional nanostructures in a desired pattern.

BACKGROUND OF THE INVENTION

One-dimensional nanostructures, such as belts, rods, tubes and wires, have become the latest focus of intensive research with their own unique applications. One-dimensional-nanostructures are model systems to investigate the dependence of electrical and thermal transport or mechanical properties as a function of size reduction. In contrast with zero-dimensional, e.g., quantum dots, and two-dimensional nanostructures, e.g., GaAs/AlGaAs heterojunctions and superlattices, direct synthesis and growth of one-dimensional nanostructures has been relatively slow due to difficulties associated with controlling the chemical composition, dimensions, and morphology. Alternatively, various one-dimensional nanostructures have been fabricated using a number of advanced nanolithographic techniques, such as electron-beam (e-beam), focused-ion-beam (FIB) writing, and scanning probe.

Carbon nanotubes are one of the most important species of one-dimensional nanostructures. Carbon nanotubes are one of four unique crystalline structures for carbon, the other three being diamond, graphite, and fullerene. In particular, carbon nanotubes refer to a helical tubular structure grown with a single wall (single-walled nanotubes) or multiple walls (multi-walled nanotubes). These types of structures are obtained by rolling single layers of graphene sheets into cylinders forming a plurality of hexagons on the tubes' surface. The sheet is a close packed array of carbon atoms having no dangling bonds. Carbon nanotubes typically have a diameter on the order of a fraction of a nanometer to a few hundred nanometers. As used herein, a "carbon nanotube" is any elongated carbon structure.

Carbon nanotubes can function as either a conductor (metallic) or a semiconductor, according to the rolled shape (chirality) and the diameter of the helical tubes. With metallic nanotubes, a one-dimensional carbon-based structure can conduct a current at room temperature with essentially no resistance. Further, electrons can be considered as moving freely through the structure, so that metallic nanotubes can be used as ideal interconnects.

Another class of one-dimensional nanostructures is nanowires. Nanowires of inorganic materials have been grown from metal (Ag, Au), elemental semiconductors (e.g., Si, and Ge), III-V semiconductors (e.g., GaAs, GaN, GaP, InAs, and InP), II-VI semiconductors (e.g., CdS, CdSe, ZnS, and ZnSe) and oxides (e.g., $SiO_2$ and ZnO). Similar to carbon nanotubes, inorganic nanowires can be synthesized with various diameters and length, depending on the synthesis technique and/or desired application needs.

Both carbon nanotubes and inorganic nanowires have been demonstrated as field effect transistors (FETs) and other basic components in nanoscale electronic such as p-n junctions, bipolar junction transistors, inverters, etc. The motivation behind the development of such nanoscale components is that "bottom-up" approach to nanoelectronics has the potential to go beyond the limits of the traditional "top-down" manufacturing techniques. A carbon nanotube is also known to be useful for providing electron emission in a vacuum device, such as a field emission display. The use of a carbon nanotube as an electron emitter has reduced the cost of vacuum devices, including the cost of a field emission display. The reduction in cost of the field emission display has been obtained with the carbon nanotube replacing other electron emitters (e.g., a Spindt tip), which generally have higher fabrication costs as compared to a carbon nanotube based electron emitter.

One well known way of growing one-dimensional nanostructures is by CVD, however, this is a high temperature process that may prevent simple integration of carbon nanotubes with other device fabrication processes.

One known approach to manufacture nanowires is a top-down approach which uses e-beam lithography. However, this e-beam process is not desirable for mass production due its throughput limitations. Nanowire devices have also been fabricated by post synthesis assembly techniques, such as dispersion on an insulating substrate followed by patterning of electrodes on a few selected nanowires using lithography. Furthermore, nanowire synthesis methods typically, whether chemical vapor deposition or solution based, produce nanowires with a range of dimension and a range of properties. Conventional nanowire fabrication approaches include forming the nanowire using, for example, chemical vapor deposition (for crystalline semiconducting nanowires) or porous alumina membrane as a template (for metallic nanowires). Once the nanowires are fabricated, they are assembled on a substrate using either a random assembly approach or an ordered approach using micro fluidic channels for potential application.

Accordingly, it is desirable to provide a simple yet reliable technique to assemble one-dimensional nanostructures selectively in a desired pattern for device applications. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

A method provides a simple yet reliable technique to assemble one-dimensional nanostructures selectively in a desired pattern for device applications. The method comprises forming a plurality of spaced apart conductive elements in a sequential pattern on a substrate and immersing the plurality of spaced apart conductive elements in a solution comprising a plurality of one-dimensional nanostructures. A voltage is applied to one of the plurality of spaced apart conductive elements in the sequential pattern, thereby causing portions of the plurality of one-dimensional nanostructures to migrate between adjacent conductive elements in sequence beginning with the one of the plurality of spaced apart conductive elements to which the voltage is applied.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

One-dimensional nanostructures show promise for the development of molecular-scale sensors, resonators, field emission displays, and logic/memory elements. One-dimensional nanostructures are herein defined as a material having a high aspect ratio of greater than 10 to 1 (length to diameter) and include, for example, belts, rods, tubes and wires, and more preferably carbon nanotubes. Furthermore, the positioning of individual carbon nanotubes at specific locations has previously been challenging and is not amenable to scale-up of a large number of devices.

The formation of one-dimensional nanostructures is disclosed for use in various applications wherever a pattern is desired, such as an on-chip inductor for electronic circuitry. The method comprises assembling one-dimensional nanostructures with macro/microscopic dimensions that are not confined to a uni-directional orientation. In the exemplary embodiment, small metallic structures at a floating potential, e.g., dots, are formed on the substrate, in a sequential trail or pattern from a starting structure, e.g., electrode. The size and spacing of the dots are dependent on the one-dimensional nanostructure material being used, its concentration, and parameters used in controlling the fabrication. The substrate, which may be a flexible substrate, is immersed in a solution of the one-dimensional nanostructures, and using the technique of dielectrophoresis, an alternating current bias is applied to the starting electrode. With the appropriate choice of amplitude and frequency, the use of an AC bias dramatically enhances the placement of desired one-dimensional nanostructures. The nearest dot to the starting electrode will generate the strongest electric field gradient and thus be the strongest attractive force for the one-dimensional nanostructures materials suspended in the solution. As the one-dimensional nanostructures accumulate from the electrode toward the first dot, they will eventually bridge the gap therebetween. The next dot closest to the first dot will then exhibit the strongest field gradient, allowing the growth process to continue. This process is repeated for as many dots as have been formed. The dots may be positioned on the substrate in a pattern by, for example, ink jet printing, to form circuit elements such as an inductor. When the one-dimensional nanostructures are grown vertically, they may form a patterned light emitting device (field emission display).

Figure 1:
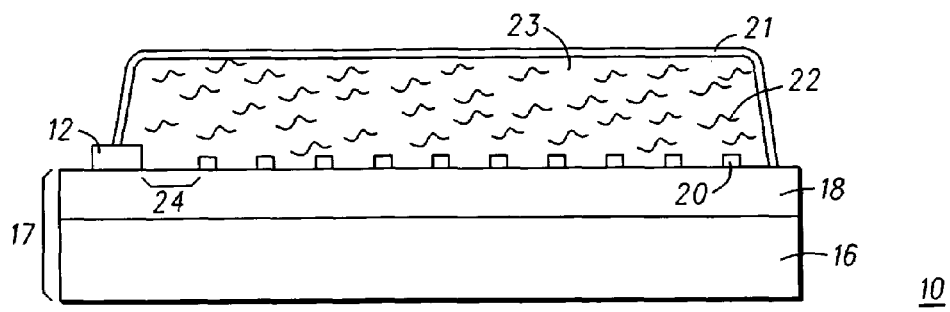
FIGS. 1 and 2 are a partial cross-sectional view and a top view of a first exemplary embodiment.
Figure 2:
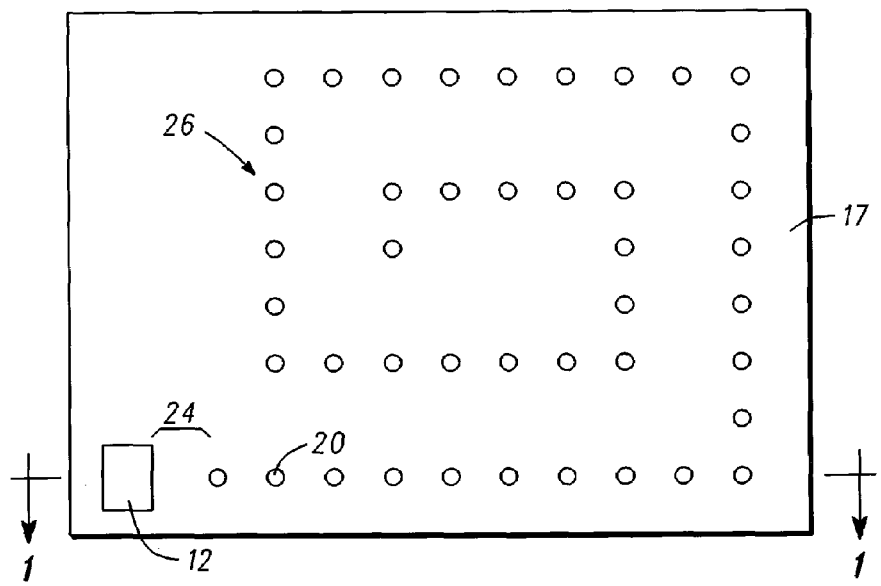

Referring now to FIG. 1, illustrated in simplified cross-sectional views, and in FIG. 2 in a top view (FIG. 1 is taken along line 1-1 of FIG. 2), is an assembled structure utilized for selective growth of catalytic nanostructures according to an exemplary embodiment of the present invention. More specifically, illustrated in FIG. 1 is an assembly 10 including an electrode 12. Although the electrode 12 is shown as positioned on insulating layer 18, it could be recessed or buried. Assembly 10 in this particular embodiment includes a substrate 17, comprising a semiconductor material 16 which has been coated with an insulating material 18. It should be understood that anticipated by this disclosure is an alternate embodiment in which substrate 17 is formed as a single layer of insulating material, such as glass, plastic, ceramic, or any dielectric material that would provide insulating properties. By forming substrate 17 of an insulating material, the need for a separate insulating layer formed on top of a semiconductive layer, or conductive layer, such as layer 18 of FIG. 1, is eliminated.

The semiconductor material 16 comprises quartz, sapphire, or any semiconductor material well known in the art, for example, silicon (Si), gallium arsenide (GaAs), germanium (Ge), silicon carbide (SiC), indium arsenide (InAs), or the like. Insulating material 18 is disclosed as comprising any material that provides insulative properties such silicon oxide ($SiO_2$), silicon nitride (SiN), or the like. The insulating material 18 comprises a thickness of between 2 nanometers and 10 microns. Semiconductor material 16 and insulating material 18 form the substrate 17 as illustrated in FIGS. 1 and 2. In this specific example, assembly 10 includes the electrode 12 formed on an uppermost surface of insulating material 18. Fabrication of the metal electrode 12 is carried out using by ink jet printing or any form of lithography, for example, photolithography, electron beam lithography, and imprint lithography on an oxidized silicon substrate 17. In some embodiments, electrode 12 may comprise a highly doped semiconductor material. Electrode 12 comprises a thickness in the range of 1 nanometer to 100,000 nanometers.

A plurality of dots 20 are formed in a desired pattern on the uppermost surface of insulating material 18. Fabrication of the dots 20 are carried out preferably by ink jet printing on an oxidized silicon substrate 17. The dots 20 may comprise any conductive material, but preferably comprise a metal such as copper, and may comprise any form factor such as a circle, rectangle, or square. In some embodiments, the dots 20 may comprise a highly doped semiconductor material. The dots 20 comprise a thickness in the range of 1 nanometer to 100,000 nanometers. The electrode 12 and the dots 20 are formed to define between a gap 20 between the electrode 12 and a first dot 20 and between each dot 20 in the sequential pattern. The gap 20 may be between 1 nanometer and 100,000 nanometers. The pattern of dots 20 shown in FIG. 2 is that of an inductor 26, but it should be realized that any pattern of dots 20 could be formed, e.g., a passive element such as an inductor or an antenna, and an active element such as a transistor.

The solution 23 within container 21 is immiscible with one-dimensional nanostructures 22 in a solution such as an aqueous environment (water based), or non-aqueous based on, for example, methanol, ethanol, or acetone. The one-dimensional nanostructures 22 are grown in a manner known in the art and placed in the solution 23.

Figure 3:
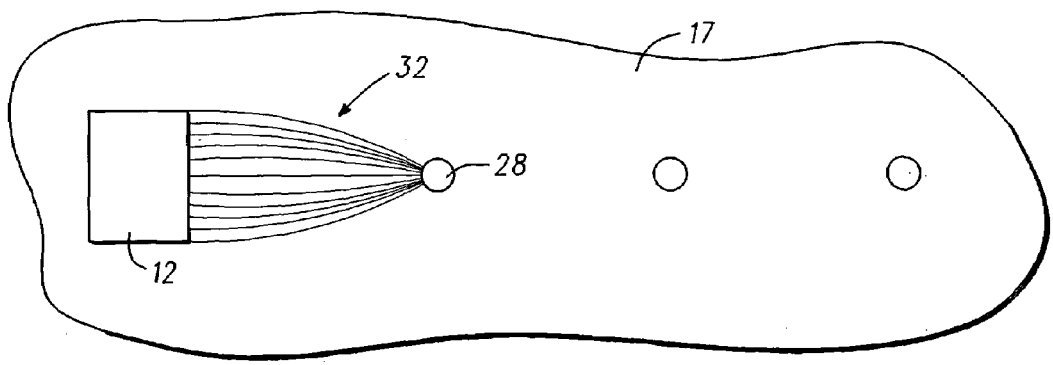
FIGS. 3-5 are a partial top view of the growth process of the first exemplary embodiment.
Figure 4:
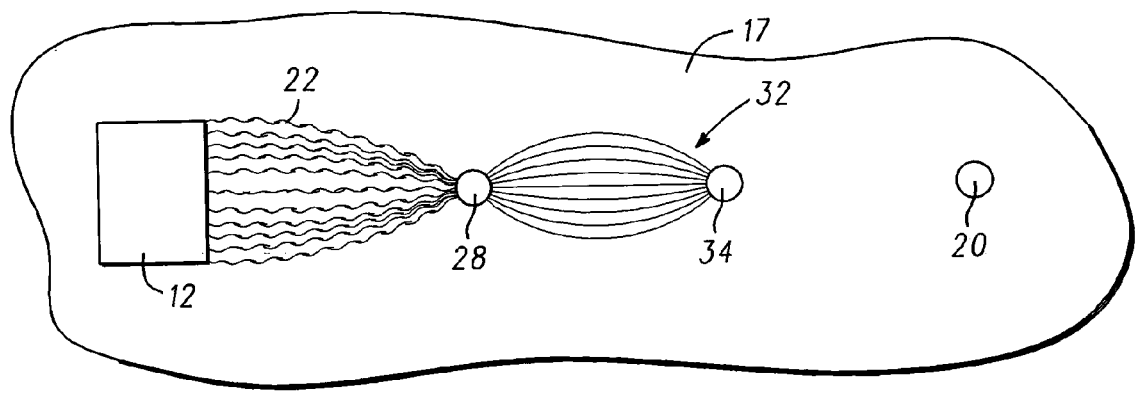

During operation in accordance with an exemplary embodiment of the present invention as illustrated in FIG. 3, an AC field is applied to electrode 12 thereby causing an electric field 32 to form between the electrode 12 and the closest dot 28. The dots 20, including the closest dot 28, are floating (without a potential). The voltage creating the AC field may range from 1.0 millivolt to 500 volts. This electric field 32 causes a migration, i.e., movement, of one-dimensional nanostructures 22 suspended within the aqueous environment 23 toward gap 24 between the electrode 12 and the closest dot 28 where the field and/or field gradient is the strongest. As the one-dimensional nanostructures attach to the electrode 12, they will line up with the electric field 32, thereby stretching out like a string from the electrode 12 to the first dot 28. It should be understood that anticipated by this disclosure is the use of any environment, such as liquid or gaseous in which nanometer-scale components are contained. FIG. 4 illustrates one-dimensional nanostructures 22 positioned between the electrode 12 and the dot 28, and on the insulating material 18. The AC field may be applied for a duration of up to several minutes depending on one-dimensional nanostructures 22 concentration in the solution 23, to position a desired number of the one-dimensional nanostructures 22 in preferred locations. Optionally, a chemical functionalization step may be performed on the insulating layer 18 to immobilize, or attach, the one-dimensional nanostructures 22 in preferred locations. Similarly, for positioning the one-dimensional nanostructures 22 only in the desired positions, a chemical functionalization step may be performed on the insulating layer 18 to repel the one-dimensional nanostructures 22 from the insulating layer 18 (FIG. 3).

Depending on the properties of the one-dimensional nanostructures being assembled, there may be some potential drop between connected dots 20. The potential applied to the first conductor (dot) 12 may need to be increased as assembly between additional dots 20 occurs. Feedback circuitry may be used to monitor the voltage drop between dots 20 being connected in order to allow for real time modification of the voltage being applied to the first conductor 12. The feedback circuitry may also be used to allow assembly only between intended dots 20.

After the assembly process, the excess solution 23 may be evaporated, spin dried, critical freeze dried, for example, all of which may be preceded by a rinse in another solution.

Post assembly lithography may be used to eliminate, e.g., ash, etch, or laser trim, unwanted assembly between dots.

Immediately prior to the application of an AC field, substrate 17 is cleaned, followed by a 20 minute soak in ethanol to remove oxidized Au. It should be understood that the amplitude of the AC bias, frequency and trapping time may vary, dependent upon the nature, desired size, and concentration of the one-dimensional nanostructures 22 and the dielectric environment in which the one-dimensional nanostructures 22 are contained. Placement time in this particular example is typically between 5 and 30 seconds. In principle, one may use a direct current (DC) field to trap one-dimensional nanostructures 22 in the gap, but such DC field is not the field of choice herein as use of a DC field will result in a success rate that is much lower as compared to an AC field. Under the influence of an AC field, one-dimensional nanostructures 22 experience a dielectrophoretic force that pulls them in the direction of maximum field gradient found in gap 24.

Although only a few one-dimensional nanostructures 22 are shown, those skilled in the art understand that any number of one-dimensional nanostructures 22 could be formed. Once the one-dimensional nanostructures 22 are positioned between the electrode 12 and the first dot 28, an electric field 32 will then form between the first dot 28 and the second dot 34 (FIG. 4). This electric field 32 causes a migration, i.e., movement, of one-dimensional nanostructures 22 suspended within the aqueous environment 23 toward gap 24 between the first dot 28 and the closest (second) dot 34 where the field 32 and/or field gradient is the strongest. As the one-dimensional nanostructures attach to the first dot 28, they will line up with the electric field 32, thereby stretching out like a string from the first dot 28 to the second dot 34. This process of forming an electric field 32 and placement of the one-dimensional nanostructures 22 will continue (FIG. 5) until the last dot 20 in the sequence is reached.

The spiral inductor 26 fabricated by the embodiment described above provides, in a first application, an electrical inductor coupled between conductive electrode 12 and the last dot 20 in the pattern for use in RF integrated circuits. The inductor 26 comprises a network of one-dimensional nanostructures 22 instead of traditional metals such as copper or aluminum. In the preferred implementation, this inductor has lower resistance than traditional metal inductors and thus has a higher Q factor. Additionally, the carbon nanotube, being an example of a one-dimensional nanostructure, has the added benefit of being immune to skin effect. In traditional metals, as the frequency of operation increases, the effective thickness of the metal is reduced as current is crowded to the outermost shell of the metal line. This results in an increase in the effective resistance of the metal and thus degrades the Q factor. In a carbon nanotube, however, the current transport is already confined to the outermost shell of the tube and this should be frequency independent.

Figure 5:
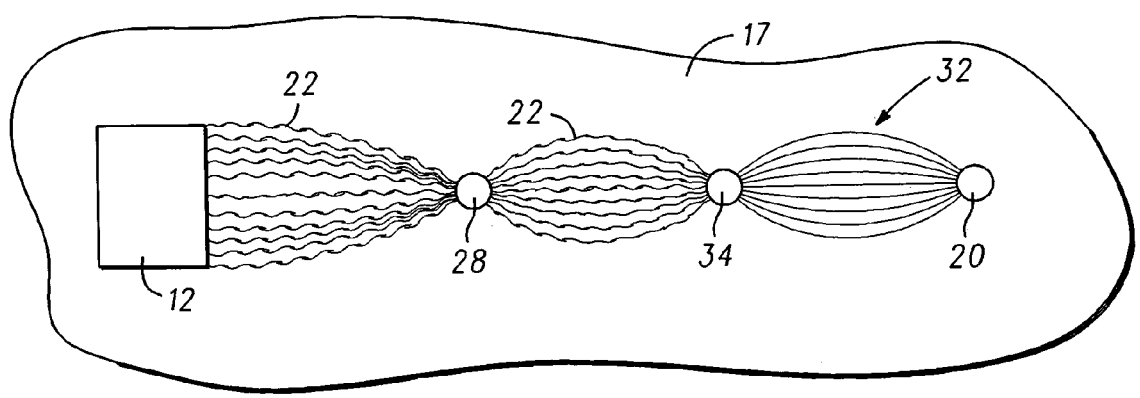

In addition to the inductor 26, the one-dimensional nanostructures 22 may be grown, for example, for use in sensors or electronic circuits, or as conductive elements, in which case a one-dimensional nanostructure 22 will be grown from one conductor to another one-dimensional nanostructures 28 to form a electrical connection between conductors as shown in FIG. 5.

Figure 6:
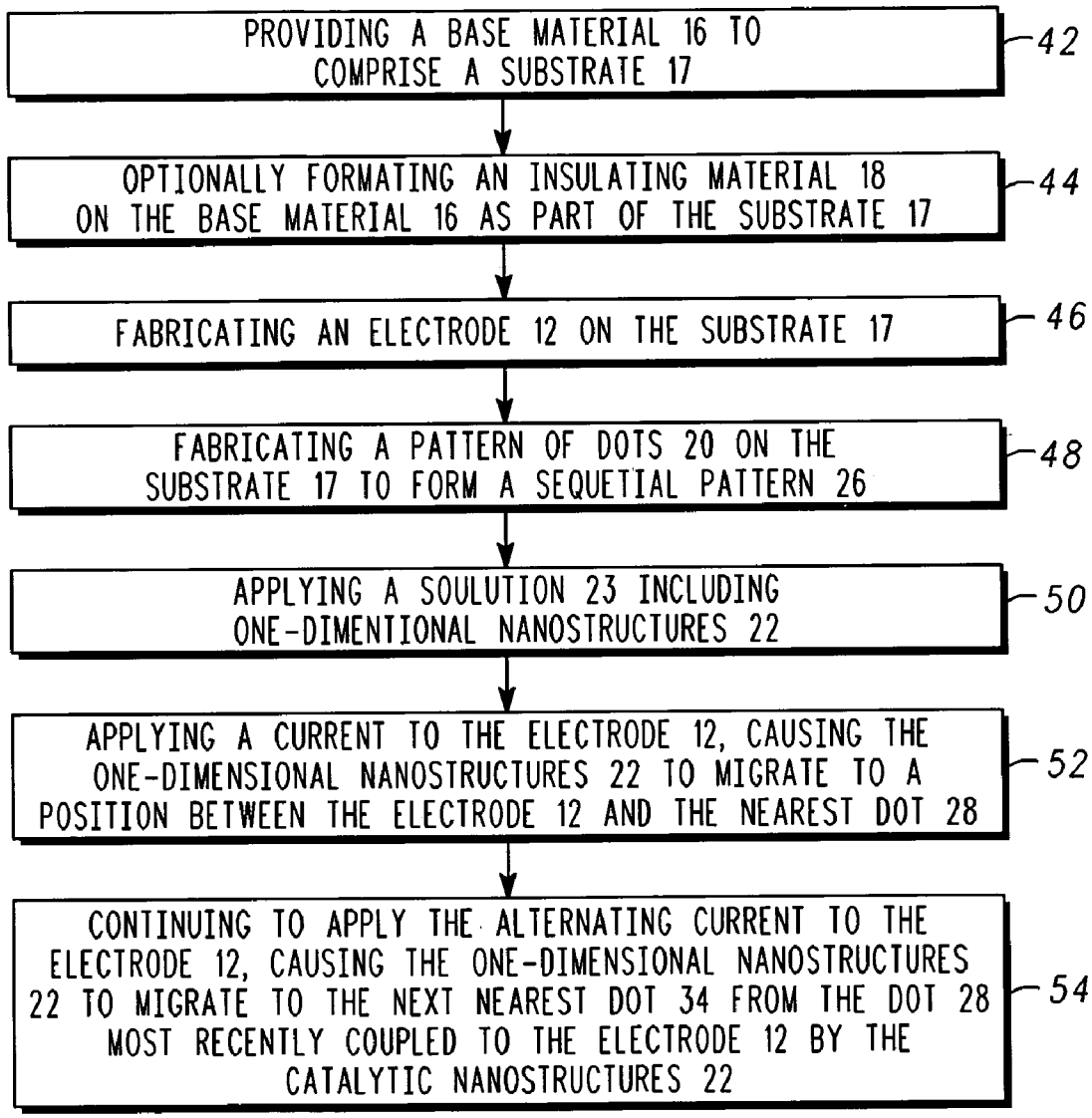
FIG. 6 is a flow chart of the method of the exemplary embodiment.

The process is further illustrated by the flow chart 40 in FIG. 6 wherein a material 16 is provided 42 to form a substrate 17. The material 16 may be coated 44 with an insulating material 18. An electrode 12 is fabricated 46 on the surface of the substrate 17. A plurality of dots 20 is fabricated 48 in a pattern on the substrate 17. A solution 23 comprising one-dimensional nanostructures 22 is applied 50 to the electrode 12 and the plurality of dots 20. An alternating current is applied 52 to the electrode 12 causing the one-dimensional nanostructures 22 to migrate to a position contiguous to the electrode 12 and first dot 28. The alternating current remains applied until one-dimensional nanostructures 22 have been positioned between each of the plurality of dots in sequence.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

The invention claimed is:

1. A method of forming a one-dimensional nanostructure device, comprising:
   providing a substrate;
   forming first, second, and third spaced apart conductive elements in a sequential pattern on the substrate, the first and second spaced apart conductive elements defining a first gap and the second and third spaced apart conductive elements defining a second gap;
   immersing the first, second, and third spaced apart conductive elements in a solution comprising a plurality of one-dimensional nanostructures; and applying a voltage to the first spaced apart conductive element in the sequential pattern wherein the second spaced apart conductive element exhibits a field gradient, thereby causing a portion of the plurality of one-dimensional nanostructures to move between the first and second spaced apart conductive elements to bridge the first gap, wherein the third spaced apart conductive element will then exhibit a field gradient, thereby causing another portion of the plurality of one-dimensional nanostructures to move between the second and third spaced apart conductive elements to bridge the second gap.

2. The method of claim 1 wherein the immersing step comprises immersing in a solution of a plurality of carbon nanotubes.

3. The method of claim 1 wherein the forming step comprises forming the at least three spaced apart conductive elements at a distance in the range of 1.0 to 100,000 nanometers from one another.

4. The method of claim 1 wherein the forming step comprises forming the at least three spaced apart conductive elements each having a thickness in the range of 1.0 to 100,000 nanometers.

5. The method of claim 1 wherein the forming step comprises forming the at least three spaced apart conductive elements each having a diameter in the range of 1.0 to 100,000 nanometers.

6. The method of claim 1 wherein the applying step comprises forming a passive element.

7. The method of claim 1 wherein the applying step comprises forming one of an inductor and an antenna.

8. The method of claim 1 wherein the applying step comprises forming an active element.

9. The method of claim 1 wherein the applying step comprises applying 1 millivolt to 500 volts.

10. The method of claim 1 further comprising removing unwanted assembly between the conductive elements.

11. A method of forming a one-dimensional nanostructure device, comprising:
providing a substrate;
forming a conductive electrode on the substrate;
forming a plurality of conductive elements in a sequential pattern on the substrate, wherein one conductive element is spaced from the conductive electrode and each remaining conductive element is spaced from another conductive element in the sequential pattern;
immersing the plurality of conductive elements in a solution comprising one-dimensional nanostructures; and
applying a voltage to the conductive electrode thereby causing a first portion of the one-dimensional nanostructures in the solution to migrate to a position between the conductive electrode and the conductive element most closely spaced therefrom, and when the first portion of one-dimensional nanostructures electrically couple the conductive electrode and the conductive element most closely spaced therefrom, additional portions of the one-dimensional nanostructures migrate from the solution to a position between the previous conductive element most closely spaced therefrom and the next closest conductive element.

12. The method of claim 11 wherein the immersing step comprises immersing in a solution of a plurality of carbon nanotubes.

13. The method of claim 11 wherein the forming step comprises forming the at least three spaced apart conductive elements at a distance in the range of 1.0 to 100,000 nanometers from one another.

14. The method of claim 11 wherein the applying step comprises applying 1 millivolt to 500 volts.

15. The method of claim 11 further comprising removing unwanted assembly between the conductive elements.

16. A method of making an electronic device, comprising:
providing a substrate;
sequentially forming first, second, and third conductive elements on the substrate, the second conductive element spaced apart from the first conductive element and the third conductive element spaced apart from the second conductive element;
immersing the substrate in a solution comprising one-dimensional nanostructures; and
applying a voltage to the first conductive element thereby creating a first electronic field between the first and second conductive elements, wherein the one-dimensional nanostructures migrate to the first electronic field to electrically couple the first and second conductive elements and thereby creating a second electronic field between the second and third conductive elements, wherein additional one-dimensional nanostructures migrate from the solution to the second electronic field to electrically couple the second and third conductive elements.

17. The method of claim 16 wherein the immersing step comprises immersing in a solution of a plurality of carbon nanotubes.

18. The method of claim 16 wherein the forming step comprises forming the at least three spaced apart conductive elements at a distance in the range of 1.0 to 100,000 nanometers from one another.

19. The method of claim 16 wherein the applying step comprises applying 1 millivolt to 500 volts.

20. The method of claim 16 further comprising removing unwanted assembly between the conductive elements.

* * * * *